United States Patent
Torigian et al.

(10) Patent No.: US 6,623,283 B1
(45) Date of Patent: Sep. 23, 2003

(54) CONNECTOR WITH BASE HAVING CHANNELS TO FACILITATE SURFACE MOUNT SOLDER ATTACHMENT

(75) Inventors: Gregory K. Torigian, Garnerville, NY (US); Gary L. Tomczak, San Diego, CA (US); Joseph J. Lynch, San Marcos, CA (US)

(73) Assignee: Autosplice, Inc., San Diego, CA (US)

( * ) Notice: Subject to any disclaimer, the term of this patent is extended or adjusted under 35 U.S.C. 154(b) by 0 days.

(21) Appl. No.: 10/027,894

(22) Filed: Dec. 20, 2001

Related U.S. Application Data

(63) Continuation-in-part of application No. 09/520,427, filed on Mar. 8, 2000, now abandoned.

(51) Int. Cl.⁷ ................................. H01R 4/02
(52) U.S. Cl. ....................... 439/83; 439/876
(58) Field of Search ..................... 439/83, 876; 29/840; 228/180.21, 245, 246, 248.1, 165, 167, 254; 361/773, 772, 774, 760, 782, 783; 257/696, 779, 773; 174/260

(56) References Cited

U.S. PATENT DOCUMENTS

| | | | | |
|---|---|---|---|---|
| 5,249,975 A | * | 10/1993 | Baderschneider et al. | 439/83 |
| 5,631,806 A | * | 5/1997 | Fried et al. | 174/261 |
| 5,641,291 A | * | 6/1997 | Sueki et al. | 439/74 |
| 5,816,868 A | * | 10/1998 | Legrady et al. | 228/215 |
| 6,011,222 A | * | 1/2000 | Sekiya et al. | 174/265 |
| 6,088,236 A | * | 7/2000 | Tomura et al. | 174/259 |
| 6,246,587 B1 | * | 6/2001 | Chen | 174/260 |

* cited by examiner

*Primary Examiner*—P. Austin Bradley
*Assistant Examiner*—Edwin A. León

(57) ABSTRACT

A surface mount connector for circuit board attachment is provided in the form of an elongate pin with a head or base formed at the lower end of the pin. The base has a bottom surface that extends substantially normal to the axis of the pin and is dimensioned to be positioned on, and soldered to, a pad on a primary circuit board. A solder bond is achieved by re-flowing a quantity of solder applied to the pad along with a quantity of flux before placing the base on top of the quantity of solder. The base is formed with a plurality of channels that open through the bottom surface and through a peripheral wall of the base for permitting gases generated by vaporizing the flux during solder re-flow to escape from underneath the base and to increase the strength of the solder bond between the pad and the base. Exhaustion of the gases prevents undesirable skating of the connector and misalignment and eliminates voids in the solder bond that would otherwise weaken the bond.

13 Claims, 3 Drawing Sheets

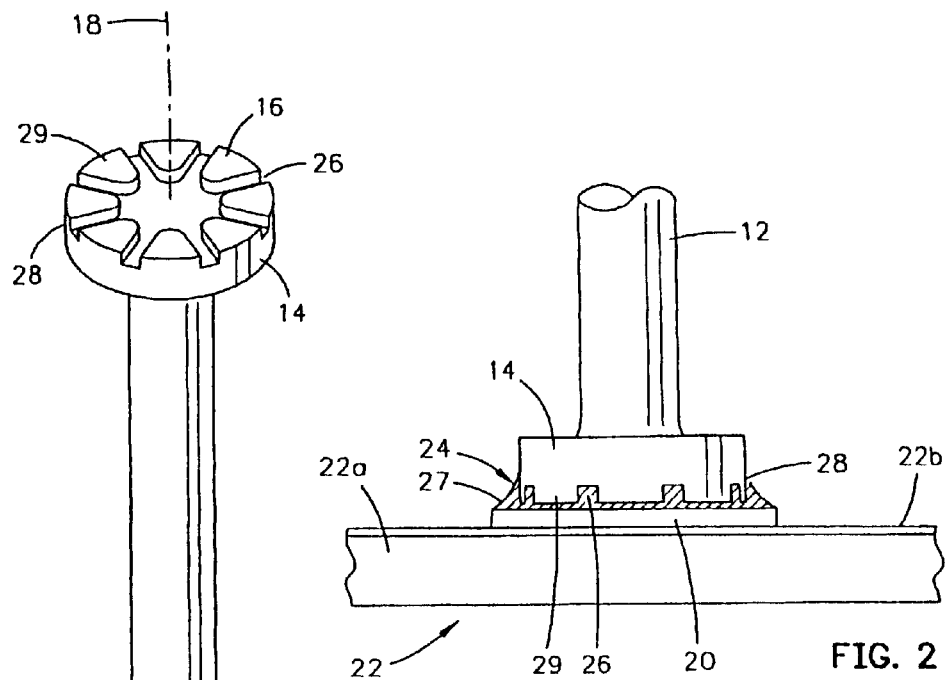
FIG. 2
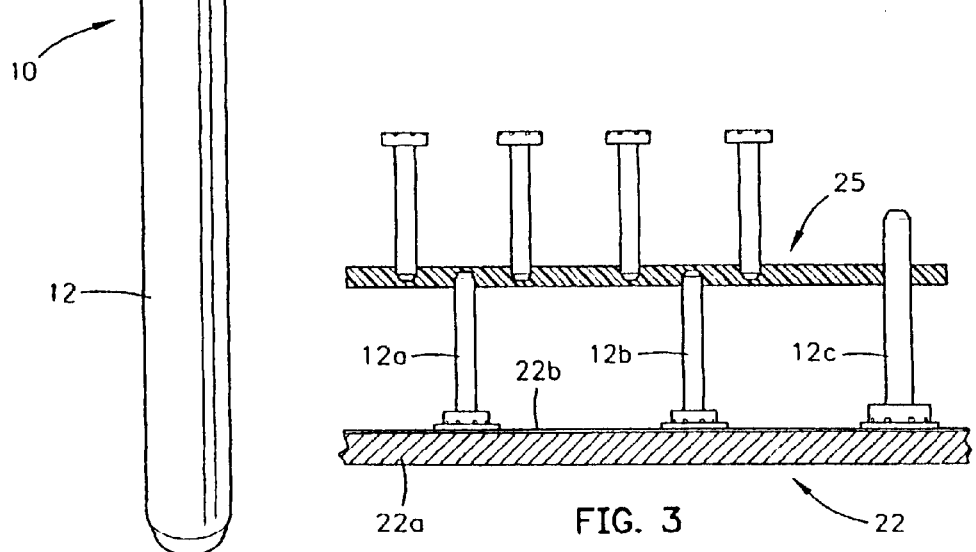
FIG. 1
FIG. 3

US 6,623,283 B1

CONNECTOR WITH BASE HAVING CHANNELS TO FACILITATE SURFACE MOUNT SOLDER ATTACHMENT

RELATED APPLICATION

This application is a continuation-in-part of a commonly-assigned application, Ser. No. 09/520,427, filed Mar. 8, 2000.

BACKGROUND OF THE INVENTION

The present invention relates to electronic assemblies, and more particularly, to connectors adapted for soldering to surface mount technology (SMT) circuit boards.

Connectors such as conductive pins and posts have long been used for electrically and/or mechanically connecting leads, terminals and electronic components to conductive traces or other devices mounted on printed circuit boards (PCBs) and in some cases, for connecting one PCB to an adjacent PCB. In recent years pins and posts have been developed for SMT applications. But problems arise in soldering one end of a pin to a PCB without a through-hole for holding the pin end. With SMT, pins are provided with a base or head that is placed on solder paste on a hole-less solder pad. However, during solder re-flow to form the solder bond, gasses may be generated. The gasses can produce voids in the solder bond which reduces strength of the bond. In addition, especially if excess solder paste has been screened onto the solder pad, which is not uncommon, the pin can undesirably move or "skate" laterally or tip-over before the solder hardens due in part to trapped gases generated by vaporized solder flux. Such skating results in misalignment problems between the pins and other connectors or circuit boards to which their upper ends are to be mated. On the other hand, if there is too little solder paste on the solder pad, the solder joint is often weak and must be re-enforced, particularly where parallel PCBs are to be later interconnected by a number of pins that extend perpendicularly therebetween.

The skating problem can be overcome by fixturing the pins in place during re-flow, but this adds cost and complexity to the assembly operation. However, this may not solve the problem of the gas-generated voids. One technique for strengthening the solder bond between a pin head and an underlying SMT circuit board involves a second soldering operation including the application of a relatively large volume of solder around and on top of the pin head, and re-flowing this large volume of solder to create a substantial fillet. This is time consuming and each additional step in the manufacturing process adds cost.

Therefore, it would be desirable to provide an improved pin geometry and SMT method that would be adapted for soldering to an SMT circuit board and would overcome the undesirable skating and void problems while at the same time enhancing the solder bond strength. However, any such improved pin geometry must allow reasonably inexpensive pin manufacture as well as permit the pin to be readily handled by automated pick and place machines that typically employ a pneumatic suction nozzle for lifting and depositing individual pins at precise locations on an SMT circuit board.

SUMMARY OF THE INVENTION

The present invention provides a surface mount connector for circuit board attachment in the form of an elongate pin with a head or base formed at the lower end of the pin. The base has a bottom surface that extends substantially normal to the axis of the pin and is dimensioned to be positioned on, and bonded to, a parallel-oriented pad on a primary circuit board, with solder or adhesive. The upper end of the pin is dimensioned and configured to be engageable with a mating connector or a secondary circuit board. The base is formed with at least one downwardly opening, laterally-extending channel that also opens through a peripheral wall of the base for permitting gases generated by vaporizing a solder flux during solder re-flow to escape from underneath the base. Exhaustion of the gases prevents undesirable skating of the connector and misalignment and eliminates voids in the solder bond that would otherwise weaken the solder bond. In addition, the channel increases the surface area contact between the solder and the base and provides a predictable degree of wicking, thereby further enhancing solder bond strength.

Preferably, the invention is applied to situations where individual pins are individually placed base down on the solder-paste-covered solid pad of the primary circuit board, because it is in that environment that the likelihood of undesirable bond voids and pin skating is increased.

Preferably, the bottom-side of the base comprises a plurality of intersecting channels that extend out to the periphery of the base, and preferably are symmetrically arranged on the bottom side as this configuration promotes outgassing that is also symmetrical which also tends to prevent pin fall-over during the soldering operation.

It is understood that SMT means that the board pad on which the SMT pin is mounted, but not adjacent parts of the board, is free of holes, and the pin does not have a section, usually called a Atail@, that enters a hole in the pad. A principal aim of SMT is to avoid the use of pins with a projecting section that is typically inside a hole in the board to maintain its position during the soldering process and to strengthen its mounting. Hence, a feature of the invention is the combination of a circuit board with at least one hole-free mounting pad on top of which is solder-bonded the base of an SMT component, the base being parallel to the mounting pad and comprising at least one channel extending out to the base periphery for the outgassing of gasses generated during the soldering process to reduce the tendency for the component to skate or undesirably move, rather than self-center, before the solder-bonding and to strengthen the bond.

The present invention also provides a circuit board interconnection method. The method first involves the step of forming a circuit board with at least one conductive pad. A layer of flux and solder paste is applied to the pad. The base of a connector is positioned on top of the solder paste. The bottom surface of the base is formed with a plurality of channels that are configured for capturing and venting vaporized flux gases. The solder paste is heated to re-flow the solder and cause the solder to wick into the channels. The solder is allowed to cool to form a solder bond between the base and the pad. Venting of the flux gases helps prevent undesirable skating or tip-over of the connector. It also increases the strength of the solder bond between the pad and the connector by eliminating voids and increasing the amount of surface of the base that is contacted by the solder than would otherwise be achieved with a flat base or a tubular base.

BRIEF DESCRIPTION OF THE DRAWINGS

FIG. 1 is an enlarged perspective view of a pin connector exhibiting a first embodiment of our invention.

FIG. 2 is an enlarged fragmentary side elevation view of the base of the connector of FIG. 1 soldered to a pad on the upper surface of an SMT circuit board.

FIG. 3 is a reduced diagrammatic side elevation fragmentary view of a piggy-back circuit board assembly comprising a primary circuit board and a secondary circuit board connected by three connectors of the type illustrated in FIG. 1. The circuit boards are shown in section in this figure.

DESCRIPTION OF THE PREFERRED EMBODIMENTS

Figure 4:
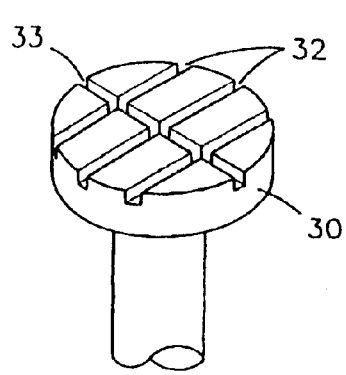
FIG. 4 is an enlarged fragmentary view of an alternate embodiment of the connector of the present invention.

Referring to FIG. 1, a surface mount connector 10 for circuit board attachment is provided in the form of an elongate cylindrical pin 12 with a cylindrical head or base 14 at the lower end of the pin 12. The connector 10 is shown inverted in FIG. 1 so that details of the underside of its base 14 are more readily visible. The connector 10 may be made of, Steel, Brass, Aluminum, Silver, Gold, high conductivity Copper, or other suitable electrically conductive metal or alloy. The connector 10 may be cold formed or manufactured in any other well known process. It may also comprise, for example, a pin and base formed of Copper and coated with a solderable or electrically conductive finish consisting of Tin, Tin/Lead alloy, Palladium/Nickel alloy or Gold flash. The base 14 has a planar bottom surface 16 that extends substantially normal to the vertical axis 18 of the pin.

The base 14 (FIG. 1) is dimensioned and configured to be positioned on, and soldered to, a pad 20 (FIG. 2) formed on a primary SMT circuit board 22. The pad 20 typically has a planar upper surface that is parallel to that of the pin bottom surface 16. As used herein the term Acircuit board@ includes any substrate, planar or otherwise shaped, that is used to support one or more electrical and/or mechanical components, including, but not limited to, printed circuit boards (PCBs), surface mount technology (SMT) boards, ceramic substrates, and insulated metal substrates (IMSs).

Though the board may have holes elsewhere, the pad or pads 20 are hole-less. The pad 20 is typically connected to a conductive trace or circuit (not visible in FIG. 2) also formed on the surface of the SMT circuit board 22. A solder bond 24 is achieved by re-flowing a quantity of flux laden solder paste applied to the pad 20 upper surface before placing the base 14, bottom surface 16 down, on top of the quantity of solder paste. The solder bond 24 is designated generally by the arrow in FIG. 2. The flux may be separately applied to the pad 20 before applying a solder paste not having flux mixed into the same.

The upper end of the pin 12 (shown at the bottom of FIG. 1.) is dimensioned and configured to be engageable with a mating connector (not illustrated) or a secondary circuit board 25 (FIG. 3). The secondary circuit board 25 has through-holes for snugly receiving the upper ends of pins 12a, 12b and 12c usually after they have been soldered to the primary circuit board 22. As shown in FIG. 1, the upper end of the pin 12 is preferably shaped to ease insertion into a hole in the corresponding through hole in the secondary circuit board 25. This shape of the upper end of the pin 12 may be a simple taper, chamfer or pointed conical configuration, for example. By way of example, the primary SMT circuit board 22 may have a metal substrate 22a with a dielectric layer 22b on which the pad 20 is formned that acts as a heat sink for a power circuit supported and interconnected thereby. The secondary circuit board 25 may have a conventional FR-4 substrate that supports and interconnects a logic circuit that controls the power circuit through the pins 12a, 12b, 12c, etc.

Referring again to FIG. 1, the base 14 is formed with a plurality of radially extending channels 26 that open through the bottom surface 16 and through a peripheral vertical side surface or wall 28 of the base 14, and interconnect at their centers. The channels 26 permit gases generated by vaporizing the flux during solder re-flow to escape from underneath the base 14 and to increase the strength of the solder bond 24 between the pad 20 and the base 14. Exhaustion of the gases reduces the potential for undesirable skating of the connector 10 and connector tip-over and facilitates proper head to pad alignment thereby avoiding misalignment between a plurality of such connectors with their corresponding through holes in the secondary circuit board 25. The solder wicks into the channels 26, forming fillets 27 rather than being forced out randomly under the weight of the pin 12. The channels 26 also eliminate voids in the solder bond 24 that would otherwise weaken the bond 24. In addition, the channels 26 increase the surface area contact between the solder 24 and the base 14 and provide a predictable degree of wicking, thereby further, enhancing solder bond strength. In effect multiple fillets 27 are created. The overall fillet area in the X, Y and Z axes is increased. The size of the channels 26 is precisely machined, molded, stamped or otherwise formed. Since the amount of solder paste that is required is thus predictable, it can be screened onto the pad 20 as one step in the process of creating the improved solder bond 24. The solder bond 24 includes not only the solder directly beneath the bottom surface 16 of the base 14, but in addition the solder that wicks into the channels 26 and that which forms fillets 27 (FIG. 2) that extend from the periphery of the pad 20 and overlap the peripheral vertical wall 28 of the base 14. Our novel channel base geometries limit solder wicking to the tightly controlled depth of each channel, thus maintaining solder volume and solder joint strength. Traditional (non-channeled) pin bases permit capillary action to pull a non-predictable volume of solder up around the base and/or into the pin shaft itself, thus drawing solder and strength away from the region between the underside of the base and the conductive pad.

It will be understood that the configuration of the connector 10 can be widely varied. The base 14 need not be round or cylindrical. The pin 12 need not be round in cross section. The shape of the upper end of the pin 12 can be widely varied, as explained above. In the embodiment illustrated FIG. 1, the base 14 is formed with a plurality of radially extending channels 26 from a center recess. A plurality of circumferentially spaced triangular lands 29 with rounded edges define the channels 26 of the connector 10.

In the embodiment illustrated in FIG. 4, the base 30 is formed with a set of three parallel channels 32 and a single channel 33 that extends orthogonally relative to the channels 32 and interconnects them.

Figure 5:
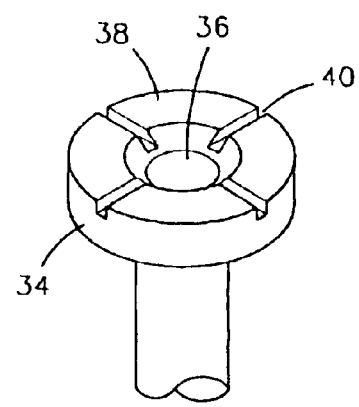
FIG. 5 is an enlarged fragmentary view of another alternate embodiment of the connector of the present invention.

In the embodiment illustrated in FIG. 5, the base 34 is formed with a generally centrally located tapered cavity 36 that opens through the bottom surface 38 of the base 34 and communicates with four radially extending channels 40.

Figure 6:
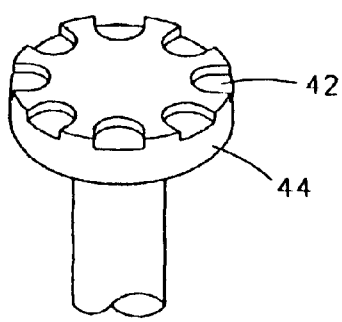
FIG. 6 is an enlarged fragmentary view of another alternate embodiment of the connector of the present invention.

In the embodiment illustrated in FIG. 6 there are a plurality of circumferentially located channels in the form of thumbnail shaped dimples 42 formed around the periphery of the base 44.

Figure 7:
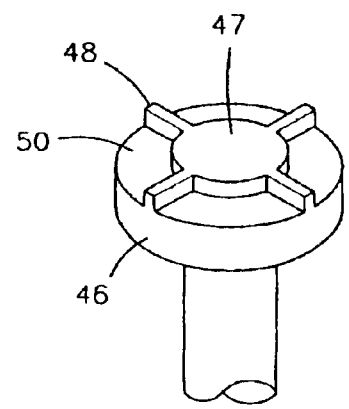
FIG. 7 is an enlarged fragmentary view of another alternate embodiment of the connector of the present invention.

In the embodiment illustrated in FIG. 7, the base 46 is formed with a central disc-shaped raised land 47 and four radially extending ribs 48 spaced ninety degrees apart that define a plurality of sector-shaped channels 50 therebetween.

Figure 8:
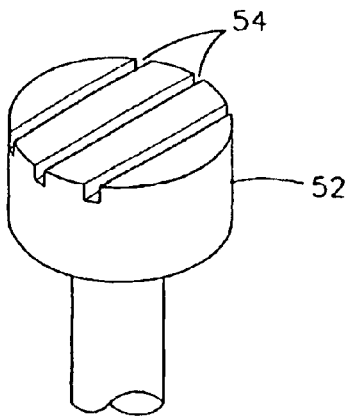
FIG. 8 is an enlarged fragmentary view of another alternate embodiment of the connector of the present invention.

In the embodiment illustrated in FIG. 8, the base 52 is thicker and is formed with three parallel channels 54. The channels 54 extend across and open through both the bottom surface of the base 52 and its side wall.

Figure 9:
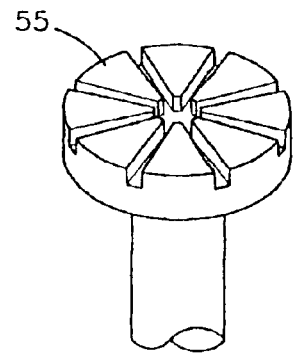
FIG. 9 is an enlarged fragmentary view of another alternate embodiment of the connector of the present invention.

The embodiment of FIG. 9 is similar to that of FIG. 1 except that the radially extending channels of the former are defined by eight pie-shaped lands 55 each having a sharp interior apex. The lands 55 are formed by the intersection of eight slots or grooves.

It is preferred that the channels intersect, as shown in FIGS. 1, 4, 5, and 9. The embodiments with non-intersecting channels shown in FIGS. 6–8 are less desirable since there are fewer exits for generated gasses in each channel.

Figure 10:
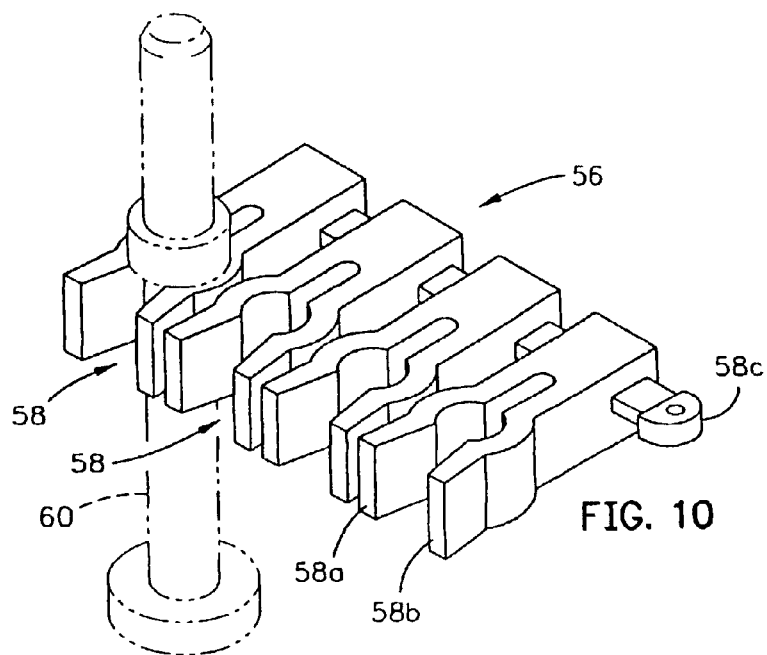
FIG. 10 is an enlarged fragmentary perspective view of a continuous carrier that may be used to temporarily hold and advance individual connectors of the type described herein in an automatic feeder of a pick and place machine. A connector of the type illustrated in FIG. 11 is shown inserted into one of the devices of the carrier.

FIG. 10 is an enlarged fragmentary perspective view of a continuous carrier 56 that may be used to advance connectors of the type described herein to an automatic feeder of a pick and place machine. The carrier 56 includes a plurality of devises or forks 58 having opposing resilient fingers 58a and 58b that spread apart to receive and grip the individual pin 12 of each connector 10. The forks 58 may be molded in continuous side-by-side connected relationship out of suitable thermoplastic material with a multi-cavity mold. One string of forks 58 is molded, allowed to harden, lifted out of the mold, and advanced in the mold. The last fork 58 is inserted into the final mold cavity so that a trailing portion 58c is over-molded by the next fork of the succeeding string of forks. After connectors 10 are automatically inserted into each fork 58, a substantial length, e.g., forty feet, of the continuous carrier 56, may be cut off and wound about a reel (not illustrated). The reel may be mounted on a suitably configured feeder (not illustrated) of an automatic pick and place machine which then removes and places each connector in turn on the board.

Figure 11:
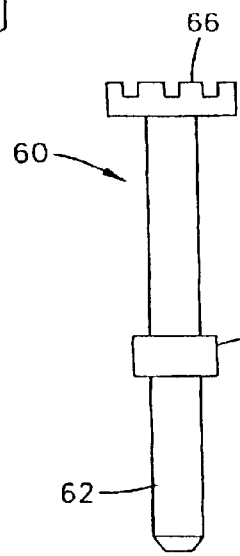
FIG. 11 is an enlarged side elevation view of another embodiment of the connector of the present invention which is formed with an annular ridge for establishing a vertical position of its pin relative to a reference surface.

In FIG. 11, the connector 60 has a pin 62 that is formed with an annular ridge 64. The ridge 64 act as stops for establishing the vertical position of the pin 62 relative to a reference surface or surfaces. The reference surface may be the upper sides or shoulders of the fingers 58a and 58b of the forks 58 of the continuous carrier 56 as illustrated in FIG. 10. A feeder is used to withdraw the connectors from the continuous carrier 56. The precise vertical placement of the connectors 60 in the carrier 56 ensures that a nozzle head of the pick and place machine will reliably pick up each of the connectors 60 in succession. The pick and place machine places the slotted base 66 of each connector 60 onto a corresponding pad 20 of the primary circuit board 22 before the solder re-flow process commences. As an alternative to the annular ridge 64, an annular groove could be formed in the shaft of the connector 60. Circumferentially spaced radially extending flanges or tabs could also be formed on the shaft of the connector. As another alternative, locating detents could be formed in the shaft of the connector 60. These various additional locating features on the pin could be used to establish stand-off, i.e., a predetermined vertical position of the connector 60 relative to the secondary circuit board 25 during insertion into the corresponding through hole.

It will also be appreciated that we have provided a useful method of providing a circuit board interconnection. Our method first involves the step of forming a circuit board 22 with at least one conductive pad 20. A layer of flux and solder paste is applied to the pad 20. The base 14 of a connector 10 is positioned on the solder paste. The base 14 is formed with a plurality of channels 26 configured for capturing and venting vaporized flux gases. The solder paste is heated to re-flow the solder and cause the solder to wick into the channels 26. The solder is allowed to cool to form a solder bond 24 between the base 14 and the pad 20. The venting of the flux gases helps prevent skating and promotes self-alignment of the connector and also increases the strength of the bond 24 by eliminating voids and increasing the amount of surface of the base 14 that is contacted by the solder than would otherwise be achieved with a flat base or a tubular base. Providing channels for outgassing permits the pin to self-center on the pad more effectively. Since the pin locating is less influenced by the expelled gasses during solder reflow and solidification, the solder fillet formation self-centers as intended for SMT devices when the gasses do not cause unbalanced movements.

The dimensions of the channels is an additional feature of the invention. Preferably, the channel dimensions are chosen in relation to the amount of solder present such that the solder when hardened fills the channels to contribute to bond strength, heat dissipation and current conductivity, but not so much solder that too thick a solder layer is formed in the final solder bond under the pin base. For a typical process, the amount of solder paste placed on the pad is about 0.006–010 inches thick, and when a conventional reflow oven is employed, it is preferred that each of the channels have a channel height of at least about the solder paste thickness, and a channel width of at least about the solder paste thickness. We have obtained satisfactory results with the channel configuration of FIG. 1 with a channel height and width at least about the paste thickness.

Figure 12:
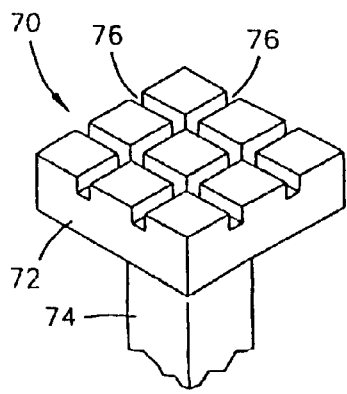
FIG. 12 is an enlarged fragmentary view of an alternate embodiment of our connector that has a rectangular base, a rectangular shaft and a waffle pattern of channels formed on the underside of its base.

FIG. 12 is an enlarged fragmentary view of an alternate embodiment 70 of our connector that has a rectangular base 72, a shaft 74 with a rectangular cross-section and a waffle pattern of orthogonally extending interconnecting channels 76 formed on the underside of its base. The channels 76 open through the bottom surface of the base 72 and extend laterally through the peripheral wall of the base 72.

While not a preferred method of the invention, the connectors of our invention could be attached to a circuit board without solder, e.g. by using a conductive adhesive and the channels would still provide beneficial centering (antiskating) effect on the substrate to which it is bonded. The channels will still provide a desirable wicking feature. The multiple fillets created by the channel various channel geometries also increase surface area contact with the adhesive, thereby increasing bond strength.

Figure 13:
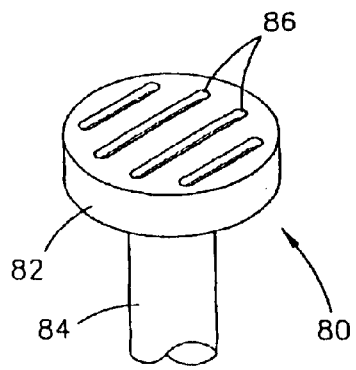
FIGS. 13 and 14 illustrate alternate embodiments of our connector wherein the channels do not open to the outside through the peripheral wall of the base.
Figure 14:
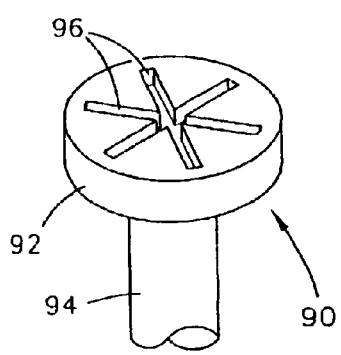

FIGS. 13 and 14 illustrate less-desirable alternate embodiments of our connector wherein the channels do not open through the peripheral wall of the base. In FIG. 13, the connector 80 has a cylindrical base 82, a shaft 84 with a round cross section connected to the base 82 and four parallel channels 86 that open through the bottom surface of the base 82 but not the peripheral wall of the base 82. In FIG. 14, the connector 90 also has a cylindrical base 92, and a shaft 94 with a round cross section connected to the base 92. Five radially extending channels 96 are formed in the base 92. The channels 96 open through the bottom surface of the base 92 but not the peripheral wall of the base 92.

Figure 15:
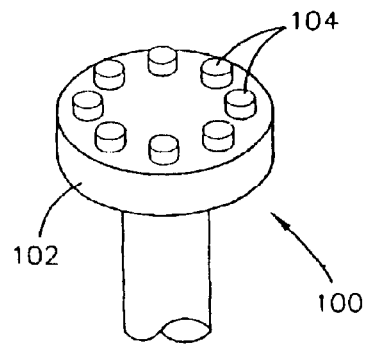
FIG. 15 is an enlarged fragmentary perspective view of the base of an alternate embodiment of our connector having plurality of round standoffs.

FIG. 15 is an enlarged fragmentary perspective view of another less-desirable alternate embodiment 100 of our connector having cylindrical base 102 with plurality of cylindrical projections or standoffs 104 which extend from the underside of the base. The standoffs 104 have co-planar bottom surfaces. This arrangement still allows for the venting of vaporized flux and also increases solder attachment surface area. The configuration of the standoffs can be widely varied.

Our invention provides a number of benefits over existing pin interconnect approaches. Specifically, our invention increases the strength of the solder bond by allowing flux out-gassing. It also reduces excessive skating that results in pin misalignment and avoids pin tip-over. Our invention also permits the area of the solder pad to be reduced. It also enhances the ability of the tacky solder paste to hold the pin vertical before solder reflow. It also minimizes the time required to perform solder re-flow and reduces the amount of solder paste required. Our invention is readily compatible with existing high volume circuit board assembly line automation techniques. It provides for process repeatability, i.e. reliable strong joints are uniformly achieved with minimal defective joints.

While the invention is most important when employed for SMT solder-bonding of individual or single pins to hole-less contact pads, it may also prove useful for the SMT solder-bonding of components having several laterally-spaced mounting pins. One example is a conventional header, in which plural pins are supported by a molded insulating body spaced vertically above the pin bases whose bottom surfaces lie in a common plane and are designed for each bottom surface to be solder-bonded to a contact pad on the same board, the component mounting being solely via the pin bases. The reason is that, with an individual pin, a displaced pin or a weak solder joint may require disposal or reworking of the entire board, whereas, the lateral support provided by the insulating body reduces the possibility of one of the pins moving and the multiple solder bonds reduce the possibility that one weak solder bond, which would be reinforced by the other solder bonds, will require reworking of the board.

While we have described our invention in terms of a number of preferred embodiments, it should be understood by those skilled in the art that our invention can be further modified in both arrangement and detail. Therefore, the protection afforded our invention should only be limited in accordance with the scope of the following claims.

What we claim is:

1. A surface mount connector for circuit board attachment, comprising:

a) an elongate pin defining an axis and having opposing ends, a lower end being formed with a base with a bottom surface extending substantially normal to the axis of the pin and dimensioned to be positioned on top of, and soldered to, a hole-less pad on a primary circuit board by re-flowing a quantity of solder applied to the pad along with a quantity of a flux before placing the base on top of the quantity of solder, the pin having an upper end being dimensioned and configured to be engageable with a mating connector or a secondary circuit board, the base being formed with at least one channel that opens through the bottom surface and through a peripheral wall of the base for permitting gases generated by vaporizing the flux during solder re-flow to escape from underneath the base to strengthen the solder bond between the pad and the base, b) the pin being formed with at least one stop for establishing a vertical position relative to a reference surface.

2. A surface mount connector for circuit board attachment, comprising:

a) an elongate pin defining an axis and having opposing ends, a lower end being formed with a base with a bottom surface extending substantially normal to the axis of the pin and dimensioned to be positioned on top of, and soldered to, a hole-less pad on a primary circuit board by re-flowing a quantity of solder applied to the pad along with a quantity of a flux before placing the base on top of the quantity of solder, the pin having an upper end being dimensioned and configured to be engageable with a mating connector or a secondary circuit board, the base being formed with at least one channel that opens through the bottom surface and through a peripheral wall of the base for permitting gases generated by vaporizing the flux during solder re-flow to escape from underneath the base to strengthen the solder bond between the pad and the base, b) the base being formed with a generally centrally located cavity or recess that opens through the bottom surface of the base and communicates with a plurality of radially-extending channels that intersect.

3. In combination:

A) a substrate area having a planar mounting pad free of holes for receiving the base of an SMT connector;

B) an SMT connector forming a solder bond with the mounting pad of the substrate area, i) said SMT connector having a longitudinal dimension and a lower end forming a base with a solid bottom surface circumscribed by a peripheral wall with the bottom surface extending generally normal to the longitudinal dimension and parallel to the mounting pad of the substrate area and positioned on top of and forming the solder bond with the mounting pad of the substrate area, ii) other than the solder bond, the SMT connector being free at its base of any lateral support to other parts of the connector or to other connectors, iii) the solid bottom surface of the base having a plurality of channels of limited depth running laterally from the inside of the bottom surface to the base peripheral wall for venting of gasses during the soldering process and for enhancing the solder bond between the base and the solid substrate area, said channels being filled with solder during the soldering process;

C) the connector being a pin having a cylindrical or square configuration;

D) the pin being formed with at least one stop for establishing a vertical position relative to a reference surface.

4. In combination:

A) a substrate area having a planar mounting pad free of holes for receiving the base of an SMT connector;

B) an SMT connector forming a solder bond with the mounting pad of the substrate area,
   i) said SMT connector having a longitudinal dimension and a lower end forming a base with a solid bottom surface circumscribed by a peripheral wall with the bottom surface extending generally normal to the longitudinal dimension and parallel to the mounting pad of the substrate area and positioned on top of and forming the solder bond with the mounting pad of the substrate area,
   ii) other than the solder bond, the SMT connector being free at its base of any lateral support to other parts of the connector or to other connectors,
   iii) the solid bottom surface of the base having a plurality of channels of limited depth running laterally from the inside of the bottom surface to the base peripheral wall for venting of gasses during the soldering process and for enhancing the solder bond between the base and the solid substrate area, said channels being filled with solder during the soldering process;

C) the base being formed with a plurality of radially-extending channels that intersect and a generally centrally located cavity or recess that opens through the bottom surface of the base and communicates with the plurality of radially-extending channels.

5. A surface mount connector for circuit board attachment, comprising:

a) an elongate pin defining an axis and having opposing ends, a lower end being formed with a base with a bottom surface extending substantially normal to the axis of the pin and dimensioned to be positioned on top of, and soldered to, a hole-less pad on a primary circuit board by re-flowing a quantity of solder applied to the pad along with a quantity of a flux before placing the base on top of the quantity of solder, the pin having an upper end dimensioned and configured to be engageable with a mating connector or a secondary circuit board, the base being formed with a plurality of laterally-extending channels each of which opens through the bottom surface and through a peripheral wall of the base, the channels being laterally separated at least at the peripheral wall of the base, the plurality of laterally-extending channels being dimensioned such as to permit gases generated by vaporizing the flux during solder re-flow to escape from underneath the base to limit pin-skating and to strengthen the solder bond between the pad and the base.

6. The surface mount connector of claim 5, wherein the pin has a cylindrical or square configuration and each of the channels have a depth and width of about 0.006–0.010 inches.

7. The surface mount connector of claim 5, wherein the pin has a cylindrical or square configuration and each of the channels have a depth and width at least about 0.006 inches.

8. The surface mount connector of claim 7, wherein the channels in the base are parallel.

9. The surface mount connector of claim 5, wherein the center of the base has a region free of the channels, and the channels extend generally radially from the base region free of the channels to the base periphery.

10. The surface mount connector of claim 9, wherein the base is formed with a plurality of radially-extending ribs that extend between the channels.

11. In combination:

A) a substrate area having a planar mounting pad free of holes for receiving the base of an SMT connector;

B) an SMT connector forming a solder bond with the mounting pad of the substrate area,
   i) said SMT connector having a longitudinal dimension and a lower end forming a base with a solid bottom surface circumscribed by a peripheral wall with the bottom surface extending generally normal to the longitudinal dimension and parallel to the mounting pad of the substrate area and positioned on top of and forming the solder bond with the mounting pad of the substrate area,
   ii) other than the solder bond, the SMT connector being free at its base of any lateral support to other parts of the connector or to other connectors,
   iii) the solid bottom surface of the base having a plurality of channels of given depth and width running laterally from the inside of the bottom surface to the base peripheral wall;

C) the solder bond having been formed by re-flowing a layer of solder paste containing flux on the pad while the base is in contact with the layer of solder paste;

D) each of the channels given depth and width being at least about the thickness of the layer of solder paste before reflowing so as to permit gases generated by vaporizing the flux during solder re-flow to escape from underneath the base to limit pin-skating and to strengthen the solder bond between the pad and the base;

E) said channels being filled with solder when the re-flowed solder hardens forming the solder bond.

12. The combination of claim 11, wherein each of the channels have a depth and width at least about 0.006 inches.

13. The combination of claim 11, wherein each of the channels have a depth and width of about 0.006–0.010 inches.

* * * * *